US007292427B1

United States Patent
Murdoch et al.

(10) Patent No.: US 7,292,427 B1
(45) Date of Patent: Nov. 6, 2007

(54) PIN LIFT CHUCK ASSEMBLY FOR WARPED SUBSTRATES

(75) Inventors: Steven Murdoch, San Ramon, CA (US); Timothy Blomgren, Tracy, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 311 days.

(21) Appl. No.: 10/962,737

(22) Filed: Oct. 12, 2004

(51) Int. Cl.
*H01L 21/67* (2006.01)
(52) U.S. Cl. .................................... 361/234
(58) Field of Classification Search ............... 361/234; 118/728, 726
See application file for complete search history.

(56) References Cited

U.S. PATENT DOCUMENTS

| | | | | |
|---|---|---|---|---|
| 4,110,958 A | * | 9/1978 | Stevens | 53/381.6 |
| 5,609,377 A | * | 3/1997 | Tanaka | 294/65 |
| 6,062,133 A | * | 5/2000 | Blalock | 100/211 |
| 6,517,130 B1 | * | 2/2003 | Donoso et al. | 294/64.1 |
| 6,599,402 B2 | * | 7/2003 | Dordi et al. | 204/212 |
| 6,722,642 B1 | * | 4/2004 | Sutton et al. | 269/21 |
| 6,756,751 B2 | * | 6/2004 | Hunter | 318/135 |
| 6,841,728 B2 | * | 1/2005 | Jones et al. | 136/244 |
| 6,857,946 B2 | * | 2/2005 | Zuniga et al. | 451/288 |
| 6,866,746 B2 | * | 3/2005 | Lei et al. | 156/345.29 |
| 7,040,971 B2 | * | 5/2006 | Zuniga et al. | 451/288 |

* cited by examiner

*Primary Examiner*—Michael Sherry
*Assistant Examiner*—Boris Benenson
(74) *Attorney, Agent, or Firm*—Joshua D. Isenberg; JDI Patent

(57) ABSTRACT

A vacuum chuck apparatus may include chuck plate having a substantially flat chucking surface, one or more lift pins, and a lifting mechanism. The lift pins are configured to clamp a substrate at three or more locations. The lifting mechanism lifts the heads of the pins above the level of the chucking surface subsequently lowers the pins to pull the substrate to substantially conform to the chucking surface. A warped substrate may be secured to the chuck surface by raising the lift pins above the surface of chuck, securing a backside of the substrate with the lift pins at three or more locations, and lowering the lift pins to draw the substrate against the surface of the chuck so that the substrate substantially conforms to the surface of the chuck.

27 Claims, 4 Drawing Sheets

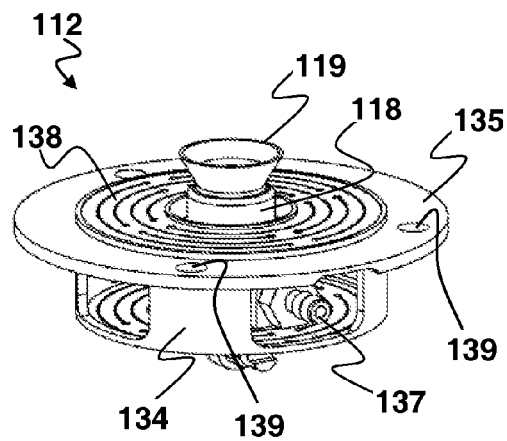
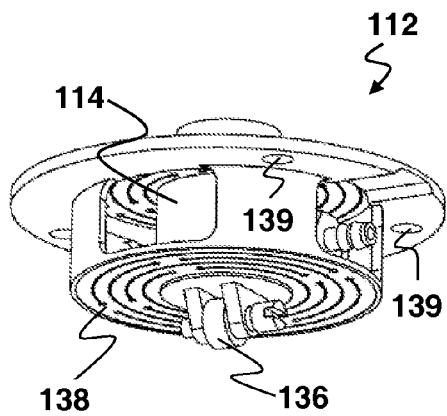
FIG. 2A　　　　　　　　FIG. 2B
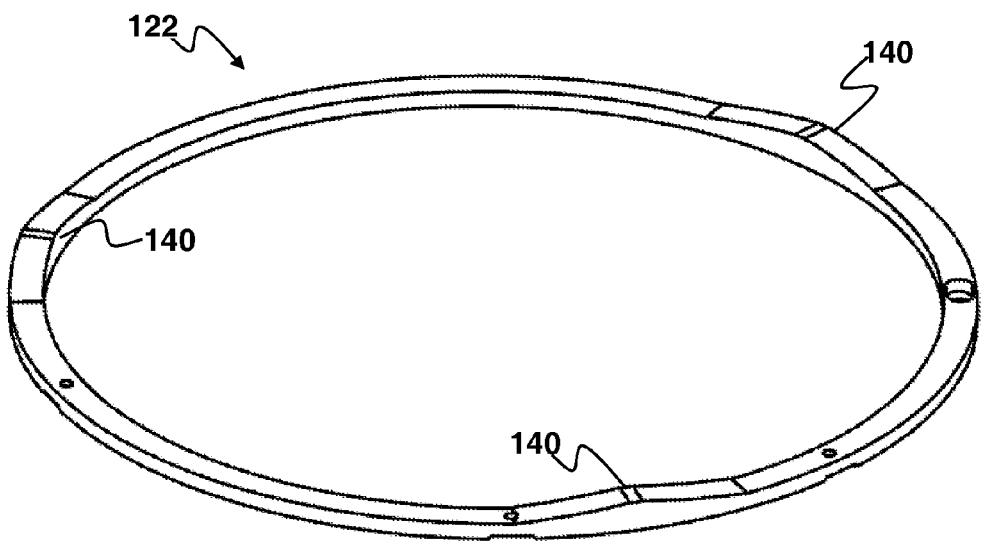
FIG. 3

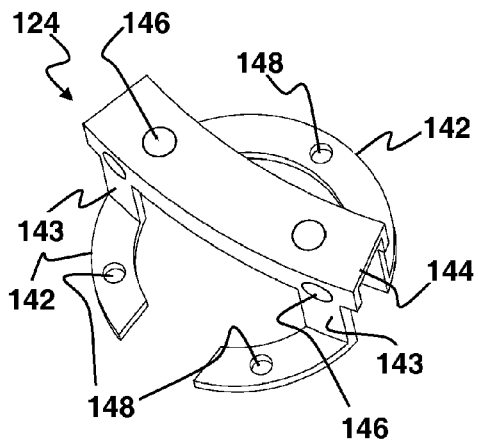
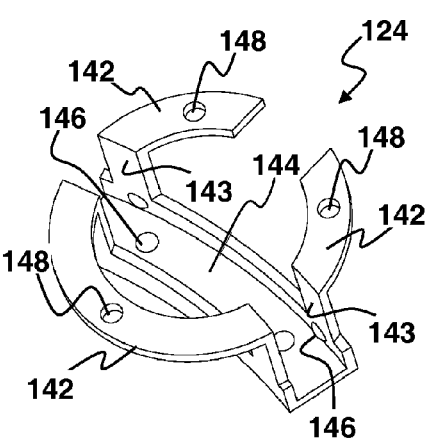
FIG. 4A    FIG. 4B
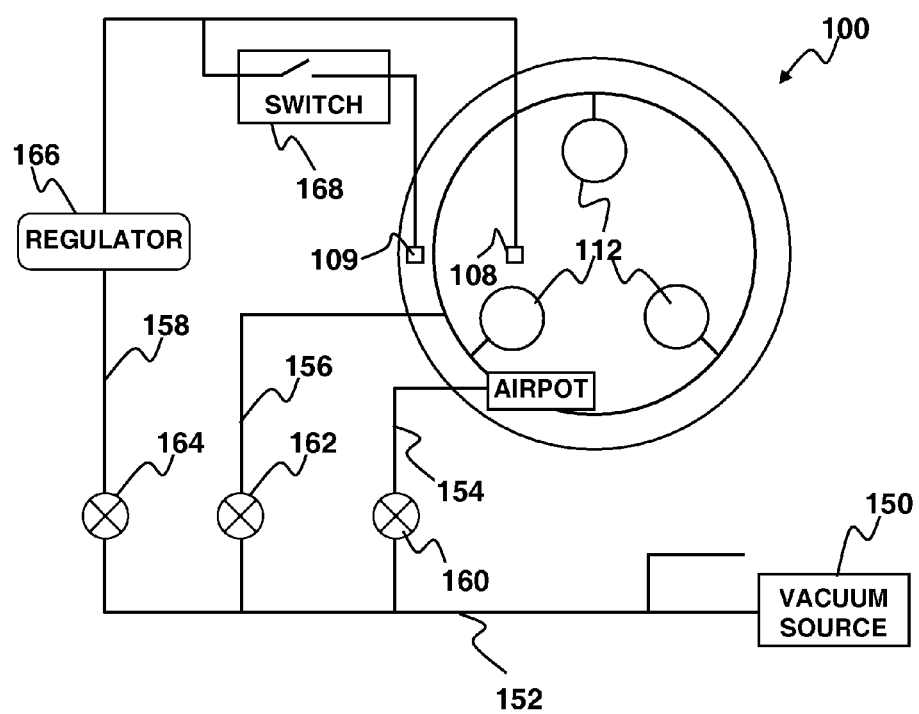
FIG. 5

PIN LIFT CHUCK ASSEMBLY FOR WARPED SUBSTRATES

FIELD OF THE INVENTION

This invention generally relates to substrate processing and more particularly to securing a substrate such that it conforms to a chuck surface.

BACKGROUND OF THE INVENTION

In semiconductor applications using metrology systems, one often encounters substrates (e.g., semiconductor wafers) that are non-planar to such a degree that they cannot normally be processed or handled by the inspection system. Such wafers may be warped as a result of upstream manufacturing processes (e.g., metal deposition) that change the planar flatness and cause these wafers to be bowl-shaped, dome-shaped, or asymmetrical (twisted). Metrology tools, such as bright field tools, often require substantially flat wafers. Wafers are typically clamped with a chuck to flatten them for metrology or processing. Distorted wafers often cannot be clamped on a chuck to flatten them sufficiently for inspection in a metrology system. Consequently, a significant loss of yield through the metrology system can result from the warping of the wafers.

The type of chuck used to clamp the wafer depends on the nature of the processing. For example, electrostatic chucks are used in vacuum systems. Atmospheric systems can use vacuum chucks, which may be either passive or active in nature. Passive vacuum chucks typically have vacuum zones delineated by rings on the surface of the chuck connected by low conductance apertures. This type of chuck is only effective for domed wafers up to approximately 400 μm of warpage and is not effective at all for bowled or asymmetric wafers.

Prior art active methods for clamping wafers in atmosphere involve a similar segmented zone vacuum chuck design. However, independent solenoid valves control the vacuum applied to each zone. This allows the clamping method across the wafer to be timed and makes the same chuck useful for both 200-mm wafers and 300-mm wafers. Employing active vacuum zones on a chuck may yield some advantage for dished and asymmetric wafers. Unfortunately, the degree of effectiveness is generally not known a priori and, consequently, effective chucking of warped wafers often requires expensive and complicated software and hardware.

Thus, there is a need in the art, for a method for chucking warped substrates and an apparatus for implementing such a method.

SUMMARY OF THE INVENTION

According to an embodiment of the present invention, a vacuum chuck apparatus may include a chuck plate having a substantially flat chucking surface, one or more lift pins, and a lifting mechanism. The one or more pins are configured to clamp a substrate at three or more locations. The lifting mechanism is configured to lift the heads of the pins above the level of the chucking surface and to subsequently lower the pins to pull the substrate to substantially conform to the chucking surface.

A warped substrate may be secured to the surface of the chuck by raising the lift pins above the surface of chuck, securing a backside of the substrate with the lift pins at three or more locations, and lowering the lift pins to draw the substrate against the surface of the chuck so that the substrate substantially conforms to the surface of the chuck.

Embodiments of the present invention facilitate effective chucking of warped substrates in spite of the effects of severe warpage through the use of specially designed lift pins that grab the backside of the substrate at three or more places and pull the substrate to conform to the chuck surface. Once the substrate has been pulled against the chuck surface by the lift pins, the chuck can hold the substrate in place with its normal chucking force.

BRIEF DESCRIPTION OF THE DRAWINGS

Other objects and advantages of the invention will become apparent upon reading the following detailed description and upon reference to the accompanying drawings in which:

FIGS. 2A-2B are close-up views of a pin assembly according to an embodiment of the present invention.

FIG. 3 is a three-dimensional diagram of a cam ring used in the pin lift vacuum chuck of FIGS. 1A-1C.

FIGS. 4A-4B are three-dimensional diagrams of a cam guide used with the cam ring of FIG. 3.

FIG. 5 is a vacuum schematic diagram showing the vacuum components and tube routing for a pin lift vacuum chuck of the type depicted in FIG. 1.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
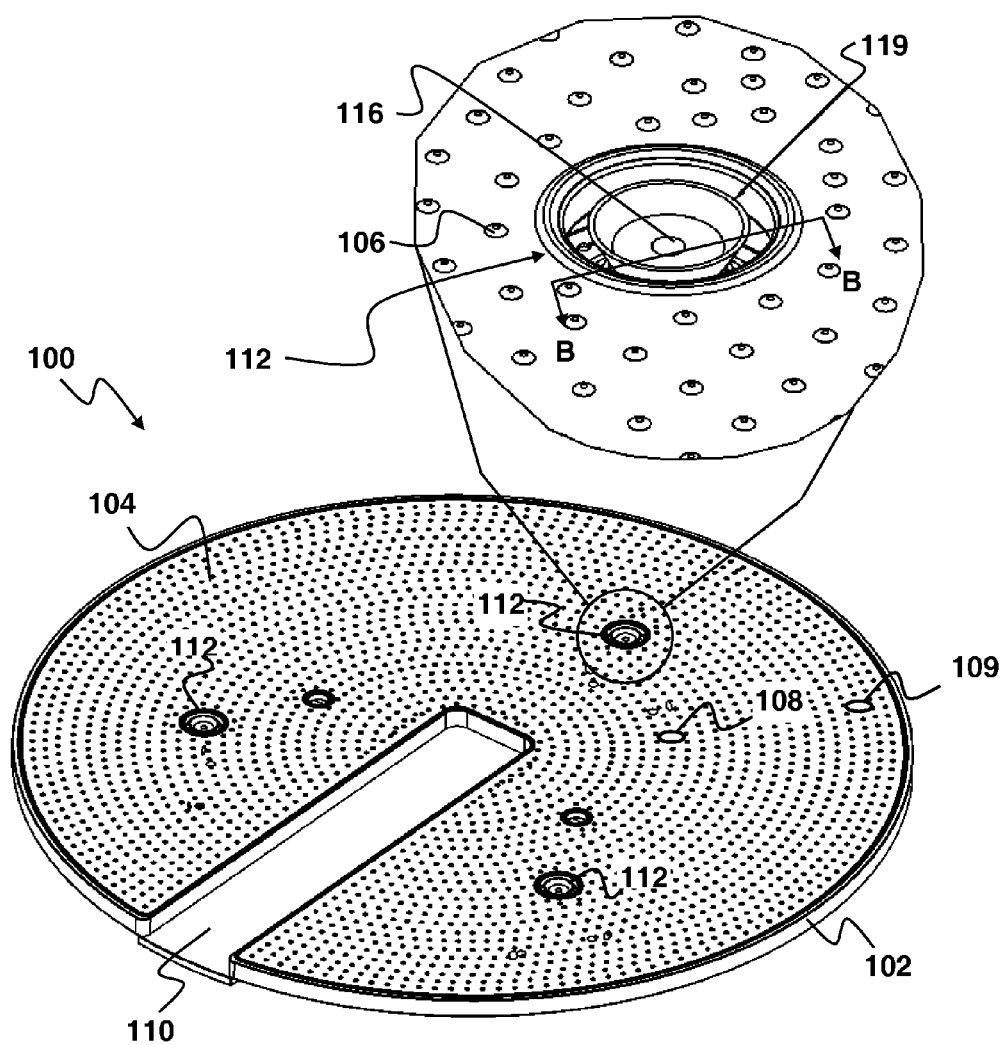
FIG. 1A is three-dimensional diagram showing an upper side view of a pin lift vacuum chuck according to an embodiment of the present invention.
Figure 1B:
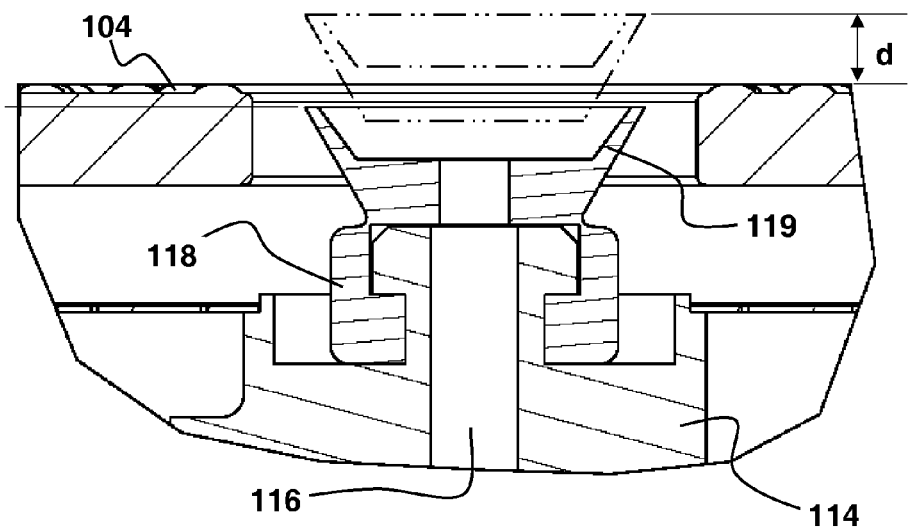
FIG. 1B is a cross-sectional diagram taken along line B-B of the inset in FIG. 1A.
Figure 1C:
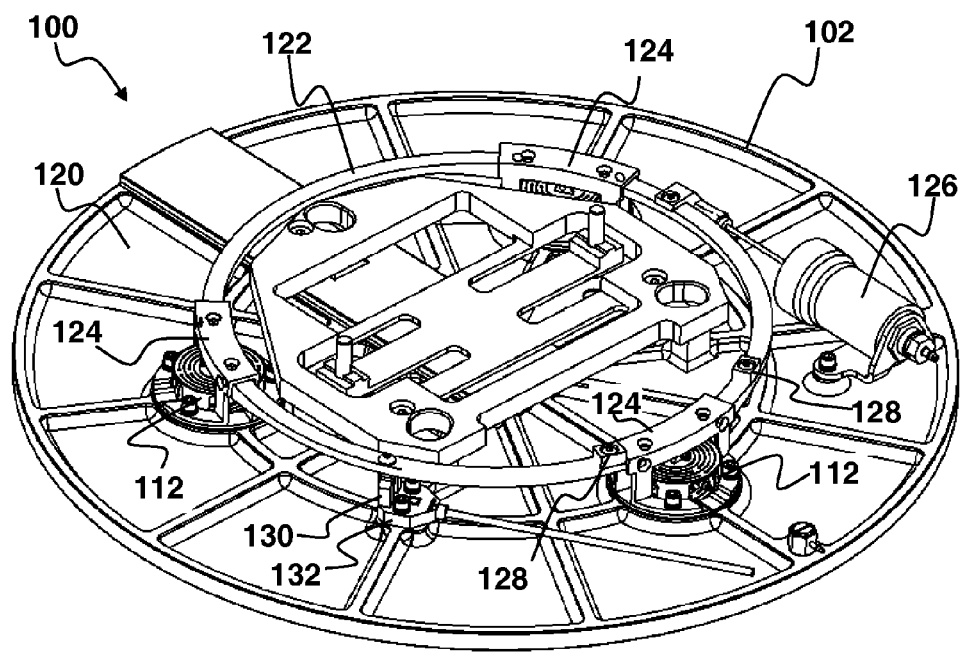
FIG. 1C is a three-dimensional diagram showing an underside view of the pin lift vacuum chuck of FIG. 1A.

FIGS. 1A-1C depict an example of a vacuum chuck apparatus 100 according to an embodiment of the present invention. As shown in FIG. 1A, the vacuum chuck apparatus 100 generally includes a chuck body 102 having a substantially flat chucking surface 104. Rounded bumps 106 may be distributed across the chucking surface 104. It is common for chucks used in semiconductor processing to use such rounded bumps to reduce contact stress with the backside of a substrate such as a semiconductor wafer. The bumps 106 may be distributed to reduce or eliminate local slope variations at the front surface of a substrate secured against the chucking surface 104. In the case of a vacuum chuck, the chuck body 102 may include one or more vacuum inlets to facilitate evacuation of air or gas from the space between the backside of the substrate and the chucking surface in order to apply a chucking force. The vacuum inlets may include first and second inlets 108, 109 respective located at different distances from the chuck body 102. Locating two inlets the inlets at different radii allows the same chuck to secure substrates of different sizes (e.g., 200-mm wafers and 300-mm wafers). In alternative embodiments, the chuck may include electrodes for electrostatic chucking, e.g., by Coulomb force or Johnson-Rahbeck effect. The chuck body 102 may also include a slot 110 to receive a robot end effecter (not shown) that transfers substrates to and from the chucking surface 104. Preferably, the robot end effecter is of a type that can grip a substrate from a backside thereof (e.g., using vacuum pads).

The chuck apparatus 100 includes vacuum lift pins 112. As shown in the detailed inset of FIG. 1A and in FIG. 1B, each vacuum lift pin generally includes a pin body 114, having a vacuum inlet 116. Each pin may further include a head 118 in the form of a vacuum cup with a compliant lip 119 that can conform to the backside of the substrate. By way of example, the pin body 116 may be made of a metal such as aluminum or stainless steel and the head 118 may be made of a silicone or similar elastomer material. As shown in FIG. 1B, the head 118 of the lift pin can be raised above the level of the chucking surface 104 by a lift distance d. The appropriate amount of lift distance d may be determined empirically and generally depends on the amount and type of substrate warpage likely to be encountered. By way of example, and without limitation, a lift distance d of about 2 mm is sufficient for typical warping of 200 mm and 300 mm semiconductor wafers.

It is desirable that the pin or pins be able to locally grip the backside of the substrate in at least three locations. Referring again to FIG. 1A, the three vacuum lift pins 112 may be distributed in a substantially equilateral fashion at a radius from a symmetry axis of the chuck body 102. In applications such as semiconductor wafer metrology, it is often desirable to be able to chuck wafers of different sizes, e.g., 200 mm wafers and 300 mm wafers. Thus, it is desirable to place the pins 112 at a radius slightly less than 200 mm. Furthermore, the vacuum cup lip 119 should be large enough that the vacuum pin 112 can grip the substrate with sufficient force to pull it flat against the chucking surface 104. However, the relative sizes of the head 114 and vacuum cup lip 119 should be relatively small compared to the substrate to reduce particle generation and so that the substrate is substantially flat over the area of the head 114. Although three vacuum lift pins are shown and described herein, the number and placement of the lift pins is not limited to that shown.

The degree of flatness is often dependent on the tool processing the wafer. For example, a bright field metrology tool typically requires the wafer to be flat to within a deviation of less than about 1 micron perpendicular to the wafer plane over a distance of about 12,000 microns across the wafer plane, i.e., about 100 microradians or less.

It is often desirable to raise and/or lower the vacuum lift pins 112 in a substantially simultaneous fashion. This can simplify the design by obviating the need for a separate actuator for each pin assembly. Furthermore, if the lift pins 112 lower and the substrate each pin pulls the substrate against the chuck surface with the same spring force (same deflection) as the others, helping to flatten the substrate out all at once. Thus, the chuck 100 may include a mechanism for raising and/or lowering the vacuum lift pins 112 in a substantially simultaneous fashion. For example, as shown in FIG. 1C, this mechanism may be situated on an underside 120 of the chuck body 102. A cam ring 122 guided by cam guides 124 includes raised portions 140 (shown in FIG. 3). An actuator 126 such as an airpot (e.g., a vacuum actuated cylinder with a return spring) imparts a rotational movement to the cam ring. As the cam ring 122 rotates, the raised portions engage the vacuum lift pins 112. Hard stops 128 limit the amount of rotational movement of the cam ring 122. A flag 130 attached to the cam ring 122 interrupts an optical beam of a through-beam sensor 132 to indicate whether the pins are in the raised or lowered position.

The actuation of the vacuum lift pins may be appreciated by simultaneously referring to FIGS. 1C, 2A, 2B 3, 4A and 4B. Specifically, as shown in FIGS. 2A and 2B, each vacuum lift pin may include the pin body 114, a pin housing 134, a bearing 136 and spring diaphragms 138. The housing includes a flange 135 having through holes 139. The pin body 114 may include a vacuum fitting 137, e.g. a barbed fitting, that facilitates coupling flexible vacuum tubing to the vacuum inlet 116. The spring diaphragms 138 are attached coaxially to both the pin body 114 and the pin housing 134 at spaced apart locations. By way of example, the spring diaphragms 138 pin body 114 and pin housing 134 may be made of stainless steel and attached by welding, e.g., laser welding. By way of example, the spring diaphragms may be made of stainless steel roughly 8 mils thick. A pattern of slots may be formed in the diaphragm by a lithographic process, such as photo etching. The use of two spring diaphragms greatly reduces runout and restricts motion of the pin body 114 to motion along a straight line. The bearing 136, e.g., a roller bearing, engages the cam ring 122. Normal forces exerted by the raised portions of the cam ring 122 impart linear movement to the pin body 114. Spring forces exerted on the pin body by the spring diaphragms 138 provide a restoring force.

The lift pins 112 generally fit within the cam ring guides 124. As shown in FIGS. 4A-4B, the cam ring guides 124 each generally include a one or more flanges 142 connected by supports 143 to a curved channel 144. The frame includes one or more flanges 142 that define an opening that accommodates the lift pin housing 134 and is spacious enough to accommodate movement of the lift pin 112. The flanges 142 include through holes 148 that align with the through holes 139 in the flange on the lift pin housing 134. The cam ring 122 rides in the channel 144. The channel 144 has a width, depth and curvature that accommodate the cam ring 122. Friction between the channel 144 and cam ring 122 may be reduced by slide bearings 146 in the top and sides of the channel 144. By way of example, the slide bearings 146 may be in the form of plugs made of a low friction plastic material, such as Turkite, that are pressed into counterbored holes in the channel 144. The lift pin 112 and cam ring guide 124 may be secured to each other and attached to the underside 120 of the chuck body 102, e.g., by screws secured through holes 139, 148.

In the example depicted herein, vacuum forces implement the raising and lowering of the pins, the gripping of the substrate with the pins and the chucking of the substrate. This greatly simplifies the construction and operation of the chuck apparatus 100. An existing vacuum chuck may be readily modified to implement the pin lift operation described herein. Furthermore, pin lift operation may be implemented with relatively minor modifications to existing vacuum chuck controller hardware and software. Operation of the chuck apparatus 100 may be understood by reference to the schematic diagram of FIG. 5. In this example, a single vacuum source 150 applies vacuum to a main vacuum line 152. The main vacuum line 152 branches into an airpot vacuum line 154, a pin vacuum line 156 and a chuck vacuum line 158, which are respectively controlled by valves 160, 162 and 164. The airpot vacuum line 154 is fluidly coupled to the airpot 126. The pin vacuum line 156 is fluidly coupled to each of the vacuum lift pins 112. A regulator 166 disposed between chuck vacuum valve 164 and a switch 168 regulates the chucking vacuum. The switch 168 selectively couples the chucking vacuum to either the first vacuum inlet 108 and/or the second vacuum inlet 109.

Initially, valves 160, 162, 164 may be closed. A robot arm (not shown) may then deliver the substrate to the chucking surface 104. To chuck a warped substrate, such as a semiconductor wafer, the vacuum pins may be raised by opening airpot vacuum valve 160 to actuate the airpot 126 and drive the cam ring 122 to lift the pins 112. Alternatively, the pins 112 may be raised first and the substrate delivered to the raised pins. With the substrate on the raised pins 112, pin vacuum valve 162 may be opened to apply vacuum to the pins 112 thereby drawing the substrate to the pins 112. Airpot valve 160 may then be closed to allow the return spring in the airpot 126 to drive the cam ring 122 in the reverse direction so that the spring diaphragms 138 and/or gravity move the pins 112 and the substrate toward the chucking surface 104. With the substrate pulled substantially flat against the chucking surface by the pins 112, chucking vacuum valve 164 may be opened to apply a chucking vacuum between the chucking surface 102 and the substrate. If the substrate is a 200-mm wafer, vacuum switch 168 is closed and vacuum is applied only to the first vacuum inlet 108. If the substrate is a 300-mm wafer, vacuum switch 168 may be opened to apply vacuum to both the first vacuum inlet 108 and the second vacuum inlet 109. Once the substrate is chucked, the pin vacuum may be either turned off or left on.

Embodiments of the present invention allow for effective chucking of concave, convex, or asymmetrically warped substrates independent of shape. Furthermore, these embodiments can handle wafers with a maximum distortion that is about five times as large as that which is presently encountered. The chuck apparatus described herein can be a drop-in replacement for standard chuck components.

Embodiments of the present invention can increase throughput of substrates by using the pin features only when necessary for warped wafers, thereby saving time during normal wafer operation. Embodiments also allow processing of warped wafers, which could not previously have been processed due the amount of warpage.

Although examples are described herein in terms of vacuum chucks and vacuum lift pins, embodiments of the present invention may be adapted for use with other types of chucks and lift pins, such as electrostatic, coulomb or Johnson-Rahbeck chucks and lift pins.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A vacuum chuck apparatus, comprising:
   a chuck body having a substantially flat chucking surface;
   three or more lift pins, each lift pin having a head, the three or more lift pins being configured to clamp a substrate at three or more locations; and
   a lifting mechanism configured to lift the heads of the lift pins above the level of the chucking surface, wherein the lifting mechanism is configured to subsequently lower the lift pins to pull the substrate to substantially conform to the chucking surface.

2. The apparatus of claim 1 wherein the lifting mechanism lifts the lift pins substantially simultaneously.

3. The apparatus of claim 1 wherein the three or more lift pins include at least three vacuum pins.

4. The apparatus of claim 1, further comprising a sensor that senses an up or down position of the lift pins.

5. The apparatus of claim 1 wherein the head of one or more of the lift pins includes a vacuum cup of flexible material having a compliant lip that can conform to a non-planar surface of a backside of a substrate.

6. The apparatus of claim 5 wherein a surface area of the vacuum cup is sufficiently large that the vacuum cup can pull the substrate with sufficient force to conform to the chucking surface.

7. The apparatus of claim 6 wherein the surface area of the vacuum cup is sufficiently small that the vacuum cup can attach to a backside of the substrate in spite of a curvature of the substrate.

8. The apparatus of claim 1, wherein one or more of the lift pins includes a housing, two or more spring diaphragms secured to the housing in a substantially coaxial, spaced-apart relationship.

9. The apparatus of claim 1, wherein the lifting mechanism includes a cam ring disposed for rotation about a ring axis on an underside of the chuck plate, the cam ring having a cam profile that engages the one or more lift pins, wherein the cam profile includes one or more raised portions, wherein each raised portion, whereby as the ring rotates about the ring axis, the raised portions cause the lift pins to raise or lower.

10. The apparatus of claim 9 wherein the raised portions are shaped and spaced along the ring such that the raised portions raise the lift pins substantially simultaneously when the raised portions engage the lift pins as ring rotates.

11. The apparatus of claim 9 wherein the cam ring further includes two hard stops that define the limits of rotation of the cam ring.

12. The apparatus of claim 9, further comprising an optical through-beam sensor disposed on the underside of the chuck plate proximate the cam ring, wherein the cam ring further comprises a flag positioned to interrupt an optical beam of the through-beam sensor at some rotation of the cam ring.

13. The apparatus of claim 9 further comprising one or more cam guides attached to the underside of the chuck plate, wherein the cam guides constrain motion of the cam ring to rotation about the ring axis.

14. The apparatus of claim 9 further comprising an actuator configured to drive the cam ring about the ring axis.

15. The apparatus of claim 14 wherein the actuator includes a vacuum cylinder.

16. The apparatus of claim 1 wherein the one or more lift pins are distributed across the surface of the chuck plate in such a way that the lift pins may engage substrates ranging in diameter from about 200 mm to about 300 mm.

17. The apparatus of claim 1 further comprising means for applying a chucking force that forces the substrate against the chucking surface.

18. The apparatus of claim 17 wherein the means for applying a chucking force includes a vacuum source coupled to the chucking surface.

19. A method for securing a warped substrate to the surface of a chuck, comprising the steps of:
   raising three or more lift pins above the surface of chuck;
   securing a backside of the substrate to the three or more lift pins at three or more locations; and
   lowering the lift pins to draw the substrate against the surface of the chuck so that the substrate substantially conforms to the surface of the chuck.

20. The method of claim 19, further comprising applying a chucking force to draw the substrate against the chucking surface.

21. The method of claim 20 wherein the chucking force is applied by applying a vacuum between the backside of the substrate and the surface of the chuck.

22. The method of claim 19 wherein the lift pins are raised in a substantially simultaneous fashion.

23. The method of claim 19 wherein the lift pins are lowered in a substantially simultaneous fashion.

24. The method of claim 19 wherein the three or more lift pins include one or more vacuum pins.

25. The method of claim 24 wherein the three or more lift pins include at least three vacuum pins.

26. A vacuum chuck apparatus, comprising:
   a chuck body having a substantially flat chucking surface;
   three or more vacuum lift pins, each lift pin having a head, the three or more vacuum lift pins being configured to clamp a substrate at three or more locations;
   a lifting mechanism configured to lift the heads of the pins above the level of the chucking surface, wherein the lifting mechanism is configured to subsequently lower the pins to pull the substrate to substantially conform to the chucking surface; and
   one or more vacuum inlets located on the chucking surface.

27. The apparatus of claim 26 wherein the lifting mechanism lifts the lift pins substantially simultaneously.

* * * * *